(12) United States Patent
Zeng et al.

(10) Patent No.: US 12,720,986 B2
(45) Date of Patent: Aug. 25, 2026

(54) DISPLAY PANEL AND DISPLAY APPARATUS

(71) Applicants: Chongqing Boe Display Technology Co., Ltd., Chongqing (CN); BOE Technology Group Co., Ltd., Beijing (CN)

(72) Inventors: Chao Zeng, Beijing (CN); Rui Wang, Beijing (CN)

(73) Assignees: CHONGQING BOE DISPLAY TECHNOLOGY CO., LTD., Chongqing (CN); BOE TECHNOLOGY GROUP CO., LTD., Beijing (CN)

( * ) Notice: Subject to any disclaimer, the term of this patent is extended or adjusted under 35 U.S.C. 154(b) by 784 days.

(21) Appl. No.: 18/022,995

(22) PCT Filed: Apr. 27, 2022

(86) PCT No.: PCT/CN2022/089451

§ 371 (c)(1),
(2) Date: Feb. 24, 2023

(87) PCT Pub. No.: WO2023/206113

PCT Pub. Date: Nov. 2, 2023

(65) Prior Publication Data

US 2024/0292694 A1 Aug. 29, 2024

(51) Int. Cl.
*H10K 59/131* (2023.01)
*H10K 59/90* (2023.01)

(52) U.S. Cl.
CPC ......... *H10K 59/1315* (2023.02); *H10K 59/90* (2023.02)

(58) Field of Classification Search
CPC ................................................. H10K 59/1315
See application file for complete search history.

(56) References Cited

U.S. PATENT DOCUMENTS 10,802,366 B2 10/2020 Wu et al.
10,991,726 B2 4/2021 Tsai et al.
2012/0218219 A1* 8/2012 Rappoport ........... H10K 59/131 345/174
2015/0123933 A1 5/2015 Jang et al.
2018/0129111 A1 5/2018 Wu et al.
2019/0064979 A1* 2/2019 Liu ......................... G06F 3/047
2020/0273884 A1 8/2020 Tsai et al.
(Continued)

FOREIGN PATENT DOCUMENTS

CN 101750780 A * 6/2010 ......... G02F 1/13394
CN 107342036 A 11/2017
(Continued)

*Primary Examiner* — Shaheda A Abdin
(74) *Attorney, Agent, or Firm* — XSENSUS LLP

(57) ABSTRACT

The present disclosure provides a display panel. The display panel has a display region and a non-display region at a periphery of the display region, and includes: a touch unit in the display region; a first pad group, a second pad group, a first selection circuit, and a second selection circuit in the non-display region; and a first signal connection line and a second signal connection line in the non-display region. A part of the first signal connection line is disposed on a side of the first pad group away from the second pad group.

18 Claims, 6 Drawing Sheets

(56) References Cited

U.S. PATENT DOCUMENTS

| | | | | |
|---|---|---|---|---|
| 2020/0303468 | A1* | 9/2020 | In | H10K 59/40 |
| 2020/0310580 | A1* | 10/2020 | Han | G06F 3/0414 |
| 2022/0115280 | A1* | 4/2022 | Du | H01L 22/34 |
| 2022/0310769 | A1 | 9/2022 | Zeng et al. | |
| 2023/0131015 | A1 | 4/2023 | Li | |

FOREIGN PATENT DOCUMENTS

| | | | | | |
|---|---|---|---|---|---|
| CN | 109166457 | A | | 1/2019 | |
| CN | 109979397 | A | * | 7/2019 | G09G 3/3674 |
| CN | 110707099 | A | | 1/2020 | |
| CN | 111261690 | A | | 6/2020 | |
| CN | 113514989 | A | | 10/2021 | |
| CN | 113515203 | A | | 10/2021 | |
| KR | 20100048002 | A | * | 5/2010 | G02F 1/1345 |
| WO | WO-2021081765 | A1 | * | 5/2021 | H10K 59/131 |
| WO | 2022/021207 | | | 2/2022 | |

* cited by examiner

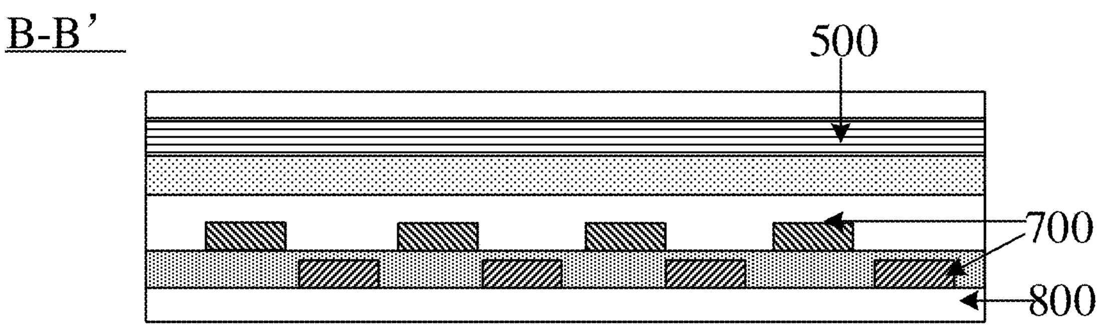
FIG. 5
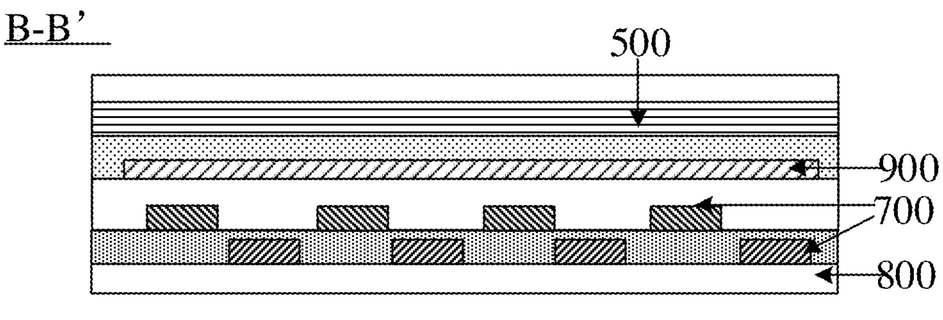
FIG. 6
A-A'
200
600
100
800
FIG. 7

DISPLAY PANEL AND DISPLAY APPARATUS

CROSS-REFERENCE TO RELATED APPLICATIONS

This application is a U.S. national stage of international application No. PCT/CN2022/089451, filed on Apr. 27, 2022, the disclosure of which is herein incorporated by reference in its entirety.

TECHNICAL FIELD

The present disclosure relates to the field of display technologies, and in particular, to a display panel and a display apparatus.

BACKGROUND OF THE INVENTION

With the development of display technologies, the use of display apparatuses is increasingly popular. Common display apparatuses include smartphones, tablet computers, televisions, and displays.

SUMMARY OF THE INVENTION

Embodiments of the present disclosure provide a display panel and a display apparatus.

According to some embodiments in the present disclosure, a display panel is provided. The display panel bas a display region and a non-display region at a periphery of the display region. The display panel includes a touch unit in the display region; a first pad group, a second pad group, a first selection circuit, and a second selection circuit in the non-display region, wherein the first selection circuit and the second selection circuit are electrically connected to the touch unit, and the first pad group is closer to the display region than the second pad group; and a first signal connection line and a second signal connection line in the non-display region, wherein the first signal connection line is connected to the first selection circuit and the second selection circuit, a part of the first signal connection line is disposed on a side of the first pad group away from the second pad group, and the second signal connection line is disposed between the first pad group and the second pad group and electrically connected to part of pads in the first pad group and part of pads in the second pad group.

In some embodiments, the display panel further includes a light-emitting device in the display region and a fan-out lead in the non-display region, wherein the fan-out lead is electrically connected to the light-emitting device and another part of the pads in the first pad group; and the fan-out lead is disposed in a different layer from the first signal connection line and the second signal connection line.

In some embodiments, the first signal connection line and the second signal connection line are disposed in a same layer and made of a same material.

In some embodiments, the display panel further includes a shielding layer between the fan-out lead and the first signal connection line, wherein the shielding layer is insulated from the first signal connection line and the fan-out lead; and an orthographic projection of the shielding layer on a substrate in the display panel at least partially overlaps an orthographic projection of the first signal connection line on the substrate, and at least partially overlaps an orthographic projection of the fan-out lead on the substrate.

In some embodiments, the orthographic projection of the shielding layer on the substrate in the display panel covers an overlapping region of the orthographic projection of the first signal connection line on the substrate and the orthographic projection of the fan-out lead on the substrate.

In some embodiments, the second signal connection line and the first signal connection line are disposed in a same layer and made of a same material, or the second signal connection line and the shielding layer are disposed in a same layer and made of a same material.

In some embodiments, the display panel further includes a pixel drive circuit and a transfer electrode in the display region, wherein the pixel drive circuit is closer to the substrate in the display panel than the light-emitting device, and the transfer electrode is disposed between the pixel drive circuit and the light-emitting device and electrically connected to the pixel drive circuit and the light-emitting device; and the transfer electrode and the first signal connection line are disposed in a same layer and made of a same material.

In some embodiments, in a case that the second signal connection line and the first signal connection line are disposed in the same layer and made of the same material, the second signal connection line and the transfer electrode are disposed in a same layer and made of a same material; and in a case that the second signal connection line and the shielding layer are disposed in the same layer and made of the same material, the second signal connection line and an electrode, in the pixel drive circuit, electrically connected to the transfer electrode are disposed in a same layer and made of a same material.

In some embodiments, the first pad group includes a plurality of first sub-pads and a plurality of second sub-pads, the plurality of second sub-pads being closer to the display region than the plurality of first sub-pads, and the plurality of second sub-pads being electrically connected to a plurality of fan-out leads respectively; and the second pad group includes a plurality of third sub-pads, the plurality of third sub-pads being electrically connected to the plurality of second sub-pads through a plurality of second signal connection lines.

In some embodiments, the second pad group further includes a plurality of fourth sub-pads on one side of the plurality of third sub-pads and a plurality of fifth sub-pads on the other side of the plurality of third sub-pads, the plurality of fourth sub-pads being electrically connected to the first selection circuit, and the plurality of fifth sub-pads being electrically connected to the second selection circuit.

In some embodiments, the non-display region includes a bending region, wherein the bending region is between the first pad group and the display region, and a part of the first signal connection line is disposed between the bending region and the first pad group.

In some embodiments, the first signal connection line includes a jumper between the bending region and the first pad group, and a first sub-connection line and a second sub-connection line respectively connected to two ends of the jumper; wherein an end of the first sub-connection line distal from the jumper is electrically connected to the first selection circuit, and an end of the second sub-connection line distal from the jumper is electrically connected to the second selection circuit.

In some embodiments, a thickness of the first signal connection line ranges from 6 microns to 7 microns.

In some embodiments, there are a plurality of touch units, and the display panel further includes a plurality of touch signal lines in the display region and a plurality of touch signal leads in the non-display region; wherein the plurality of touch signal lines are electrically connected to the plurality of touch units in a one-to-one correspondence and electrically connected to the plurality of touch signal leads in a one-to-one correspondence; and part of touch signal leads in the plurality of touch signal leads are electrically connected to the first selection circuit, and another part of the touch signal leads in the plurality of touch signal leads are electrically connected to the second selection circuit.

In some embodiments, the first pad group and the second pad group are disposed in a same layer and made of a same material, and at least partially disposed in a same layer and made of a same material as one of the touch unit and the touch signal line.

According to some embodiments in the present disclosure, a display apparatus is provided. The display apparatus includes a drive chip, a flexible circuit board, and a display panel. The display panel is the display panel defined in any of the above.

The drive chip is electrically connected to a first pad group in the display panel, and the flexible circuit board is electrically connected to a second pad group in the display panel.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and a person skilled in the art may still derive other drawings from these accompanying drawings without creative efforts.

FIG. 5 is a schematic diagram of a film layer structure at B-B' shown in FIG. 3;

FIG. 6 is a schematic diagram of another film layer structure at B-B' shown in FIG. 3;

FIG. 7 is a schematic diagram of another film layer structure at A-A' shown in FIG. 3;

DETAILED DESCRIPTION

To make the objective, technical solutions, and advantages of the present disclosure clearer, embodiments of the present disclosure are further described in detail with reference to the accompanying drawings hereinafter.

A display apparatus usually includes a display panel, a drive chip, and a flexible circuit board. The display panel has a display region and a non-display region. The display panel includes a light-emitting device in the display region, and a first pad group, a second pad group, and a connection lead in the non-display region. The first pad group is used to be bound to the drive chip. The second pad group is used to be bound to the flexible circuit board. The connection lead is configured to electrically connect the first pad group to the second pad group. In this way, the flexible circuit board applies an electrical signal to the drive chip through the connection lead, therefore controlling the light-emitting device in the display panel to emit light.

However, the connection lead in the display panel usually has a high resistance, resulting in a poor display effect of the display panel.

Figure 1:
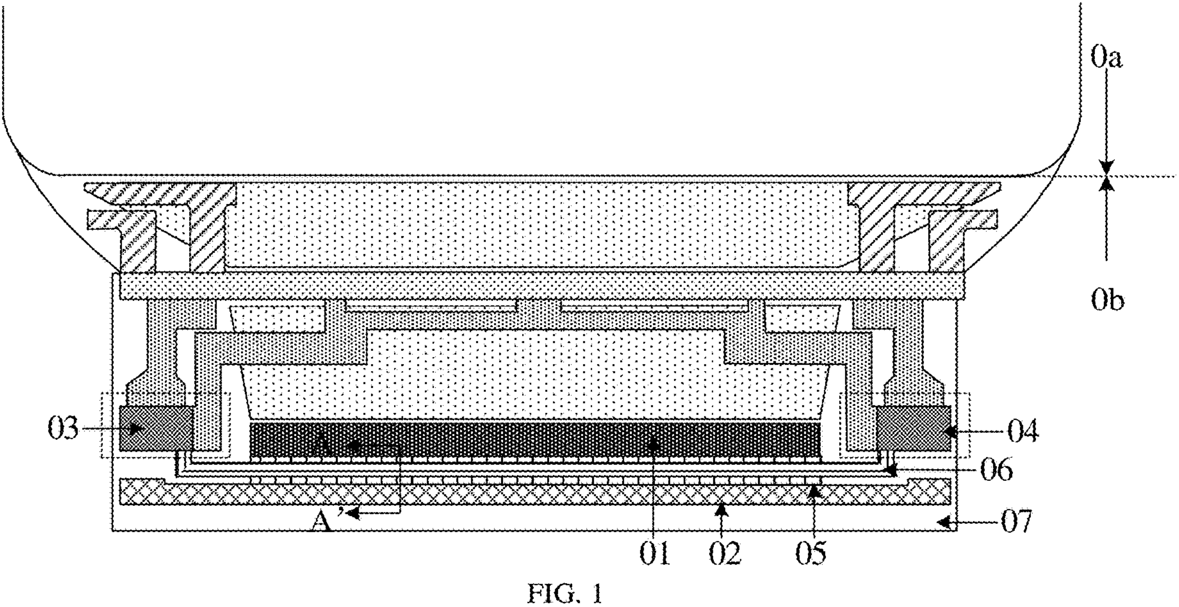
FIG. 1 is a top view of a display panel according to the related art.

In the related art, referring to FIG. 1, which is a top view of a display panel according to the related art, a display panel 00 has a display region 0*a* and a non-display region 0*b* at a periphery of the display region 0*a*. The display panel 00 includes a substrate 07, a plurality of light-emitting devices, and a plurality of touch units (not shown in the figure) in the display region 0*a*, and a first pad group 01, a second pad group 02, a first selection circuit 03, a second selection circuit 04, a first signal connection line 05, and a second signal connection line 06 in the non-display region 0*b*.

The first pad group 01 is configured to be bound to a drive chip. The second pad group 02 is configured to be bound to a flexible circuit board. The first signal connection line 05 connects a pad in the first pad group 01 to a pad in the second pad group 02. In this way, the flexible circuit board can apply an electrical signal to the drive chip through the first signal connection line 05, such that the drive chip can apply the electrical signal to the light-emitting devices in the display panel and make the light-emitting devices emit light.

The first selection circuit 03 and the second selection circuit 04 are electrically connected to the plurality of touch units in the display panel through touch leads. By using the first selection circuit 03 and the second selection circuit 04, a number of touch leads from the touch units to the non-display region 0*b* of the display panel is reduced. To enable the first selection circuit 03 and the second selection circuit 04 in the display panel 00 to simultaneously receive touch signals, the second signal connection line 06 needs to be disposed between the first selection circuit 03 and the second selection circuit 04 to connect them.

Figure 2:
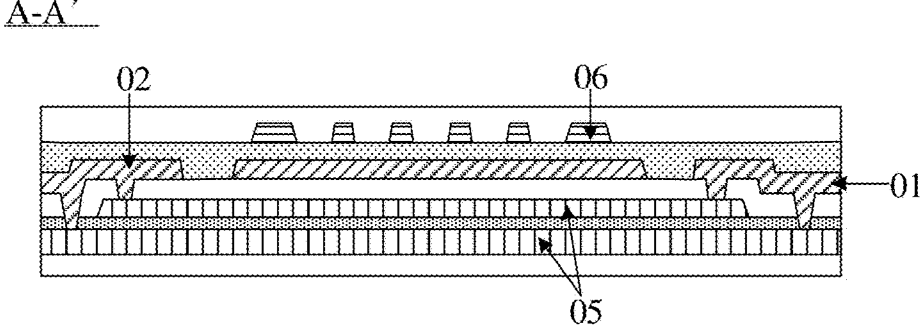
FIG. 2 is a schematic cross-sectional view of the display panel taken along line A-A' shown in FIG. 1.

In this case, because there are many traces in the non-display region 0*b* of the display panel 00, the second signal connection line 06 and the first signal connection line 05 in the non-display region 0*b* of the display panel 00 overlap. That is, the second signal connection line 06 and the first signal connection line 05 are disposed in different film layers in the non-display region 0*b*. To clearly view a film layer structure of the second signal connection line 06 and the first signal connection line 05 in the display panel 00, please refer to FIG. 2, which is a schematic cross-sectional view of the display panel taken along A-A' shown in FIG. 1. To ensure good electrical connections of the first signal connection line 05 to the first pad group 01 and the second pad group 02, the first signal connection line 05 is electrically connected to the first pad group 01 and the second pad group 02 in the manner of two layers of traces. Usually, the two layers of traces in the first signal connection line 05 are respectively disposed in same layers as two gate metal layers in the display panel, wherein the gate metal layers in the display panel are made of molybdenum with a high resistance. Therefore, a resistance of the first signal connection line 05 is usually high. resulting in the effect that the flexible circuit board applies an electrical signal to the drive chip through the first signal connection line 05 is poor, and further resulting in a poor display effect of the display panel 00.

Figure 3:
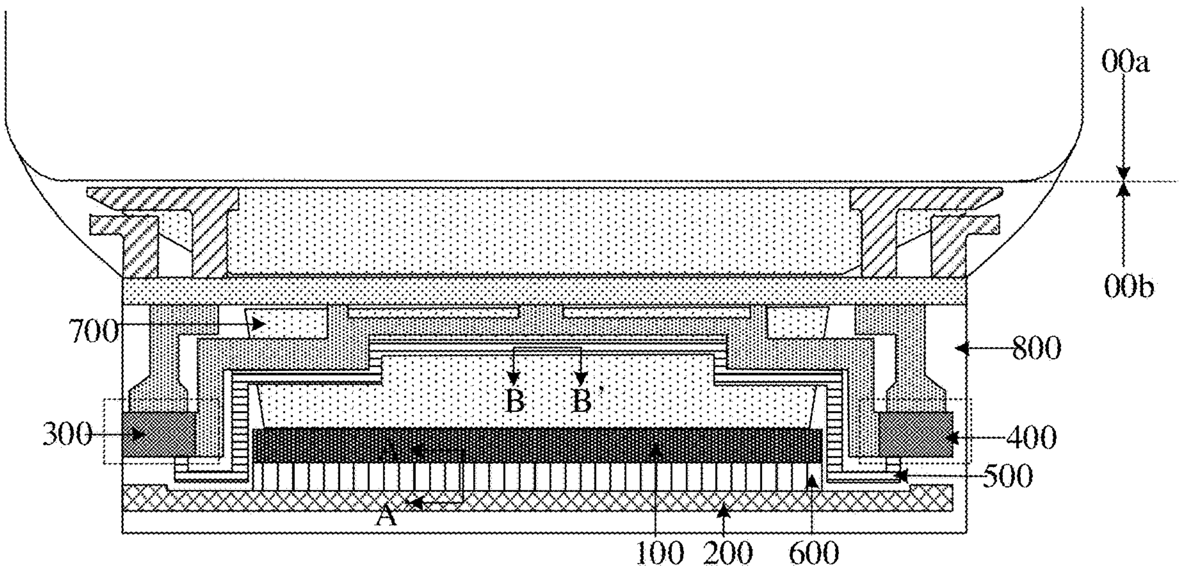
FIG. 3 is a top view of a display panel according to some embodiments of the present disclosure.

FIG. 3 is a top view of a display panel according to some embodiments of the present disclosure. Referring to FIG. 3, the display panel 000 has a display region 00*a* and a non-display region 00*b* at a periphery of the display region 00*a*. The display panel 000 includes a touch unit (not shown in the figure) in the display region 00*a*, and a first pad group 100, a second pad group 200, a first selection circuit 300, a second selection circuit 400, a first signal connection line 500, and a second signal connection line 600 in the non-display region 00*b*.

The first selection circuit 300 and the second selection circuit 400 are electrically connected to the touch unit. The first pad group 100 is closer to the display region 00*a* than the second pad group 200. The first pad group 100 is configured to be bound to a drive chip, and the second pad group 200 is configured to be bound to a flexible circuit board.

The first signal connection line 500 is connected to the first selection circuit 300 and the second selection circuit 400. A part of the first signal connection line 500 is disposed on a side of the first pad group 100 away from the second pad group 200. The second signal connection line 600 is disposed between the first pad group 100 and the second pad group 200 and electrically connected to part of pads in the first pad group 100 and part of pads in the second pad group 200. The display panel 000 controls the touch unit through the first selection circuit 300 and the second selection circuit 400. The first signal connection line 500 electrically connects the first selection circuit 300 to the second selection circuit 400, such that part of the touch units connected to the first selection circuit 300 and the other part of the touch units connected to the second selection circuit 400 can simultaneously receive touch signals.

In this case, because the part of the first signal connection line 500 is disposed on the side of the first pad group 100 away from the second pad group 200, the part of the first signal connection line 500 disposed on the side of the first pad group 100 away from the second pad group 200 does not overlap the second signal connection line 600. Therefore, a trace density in a region between the first pad group 100 and the second pad group 200 in the display panel 000 is reduced, and the second signal connection line 600 in the display panel 000 can be disposed in a different layer from a conductive layer made of a material (for example, molybdenum) with a high resistance. In this way, the second signal connection line 600 in the display panel 000 can be disposed in a same layer as a film layer other than the conductive layer made of the material with the high resistance, and a resistance of the second signal connection line 600 is reduced. The part of the pads in the first pad group 100 and the part of the pads in the second pad group 200 is electrically connected through the second signal connection line 600, which ensures that an effect that the flexible circuit board applies an electrical signal to the drive chip through the second signal connection line 600 is good and a display effect of the display panel 000 is improved.

It should be noted that to ensure a good effect of applying the electrical signal to the drive chip through the second signal connection line 600 by the flexible circuit board without changing a film layer in which the second signal connection line 600 is disposed, a material of the second signal connection line 600 needs to be replaced by a metal material with a low resistance (such as copper, aluminum, or silver). In this process, in addition to changing a material of a whole production line, different process conditions need to be explored and optimized, and a new device needs to be introduced to ensure that a second signal connection line 600 with high strength can be made through the low resistance metal material. This greatly increases costs for manufacturing the display panel 000 and makes the manufacturing process of the display panel 000 more complicated.

In summary, the display panel provided in the embodiments of the present disclosure includes the touch unit, the first pad group, the second pad group, the first selection circuit, the second selection circuit, the first signal connection line, and the second signal connection line. Because the first pad group is closer to the display region than the second pad group, and the part of the first signal connection line is disposed on the side of the first pad group away from the second pad group, the part of the first signal connection line disposed on the side of the first pad group away from the second pad group does not overlap the second signal connection line. In this way, the trace density in the region between the first pad group and the second pad group in the display panel is reduced, the second signal connection line can be disposed in the same layer as the film layer other than the conductive layer made of the material with the high resistance, and thus the resistance of the second signal connection line is reduced. The part of pads in the first pad group and the part of pads in the second pad group are electrically connected through the second signal connection line, such that the effect of applying the electrical signal to the drive chip through the second signal connection line by the flexible circuit board is good and the display effect of the display panel is good.

In some embodiments of the present disclosure, as shown in FIG. 3, the display panel 000 further includes a light-emitting device (not shown in the figure) in the display region 00*a* and a fan-out lead 700 in the non-display region 00*b*. The fan-out lead 700 is electrically connected to the light-emitting device and another part of the pads in the first pad group 100. The drive chip applies the electrical signal to the light-emitting device in the display panel 000 through the another part of the pads in the first pad group 100 and the fan-out lead 700, to enable the light-emitting device to emit light.

The fan-out lead 700 is disposed in a different layer from the first signal connection line 500 and the second signal connection line 600. The display panel 000 further includes a substrate 800. The touch unit, the light-emitting device, the fan-out lead 700, the first signal connection line 500, and the second signal connection line 600 are disposed on the substrate 800. It should be noted that in the embodiments of the present disclosure, that two conductive structures are disposed in different layers means that there is an insulation layer between two conductive layers in which the two conductive structures are respectively disposed. In some embodiments, as shown in FIG. 5, a conductive layer in which a plurality of first signal connection lines 500 are disposed and a conductive layer in which a part, in the non-display region 00*b*, of the fan-out lead 700 is disposed are different. There is an insulation layer between the conductive layer in which the first signal connection lines 500 are disposed and the conductive layer in which the part, in the non-display region 00*b*, of the fan-out lead 700 is disposed.

According to some embodiments of the present disclosure, there are a plurality of optional implementations for structures of the first signal connection line 500 and the second signal connection line 600, and only the following two implementations are used as examples for schematic description in the embodiments of the present disclosure.

Figure 4:
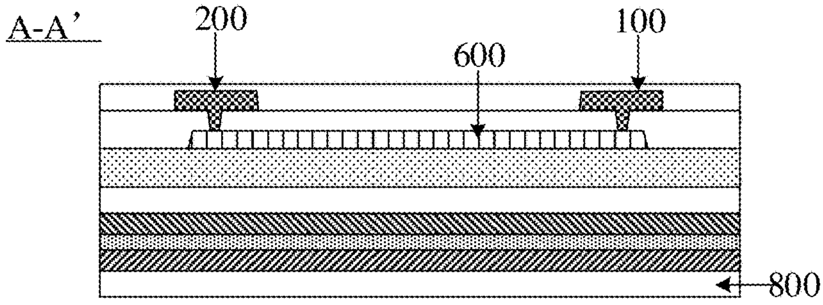
FIG. 4 is a schematic diagram of a film layer structure at A-A' shown in FIG. 3.

In a first optional implementation, please refer to FIG. 4 and FIG. 5, wherein FIG. 4 is a schematic diagram of a film layer structure at A-A' shown in FIG. 3, and FIG. 5 is a schematic diagram of a film layer structure at B-B' shown in FIG. 3. The first signal connection line 500 and the second signal connection line 600 are disposed in a same layer and made of a same material.

That is, the first signal connection line 500 and the second signal connection line 600 are formed through one patterning process. As shown in FIG. 5, the first signal connection line 500 is insulated from the fan-out lead 700. Because the first signal connection line 500 and the second signal connection line 600 are disposed in the same layer, an orthographic projection of the first signal connection line 500 on the substrate 800 does not overlap an orthographic projection of the second signal connection line 600 on the substrate 800, which ensures that the first signal connection line 500 and the second signal connection line 600 do not form a short circuit.

It should be noted that the first signal connection line 500 and the second signal connection line 600 are disposed in the same layer and made of the same material. In the embodiments of the present disclosure, that two conductive structures are disposed in a same layer and made of a same material means that the two conductive structures are disposed in a same conductive layer, and the conductive layer is formed through a same patterning process. The patterning process includes photoresist coating, exposure, development, etching, and photoresist stripping. In some embodiments, as shown in FIG. 4 and FIG. 5, a conductive layer in which the first signal connection line 500 is disposed and a conductive layer in which the second signal connection line 600 is disposed are a same conductive layer.

It should also be noted that the first pad group 100 and the second pad group 200 at A-A' are disposed in any film layer, and disposed in a same layer or different layers, which is not limited in the present disclosure. It should also be noted that the patterning process herein or in the following embodiments includes photoresist coating, exposure, development, etching, and photoresist stripping.

In a second optional implementation, please refer to FIG. 6, which is a schematic diagram of another film layer structure at B-B' shown in FIG. 3. As shown in FIG. 6, the display panel 000 further includes a shielding layer 900 between the fan-out lead 700 and the first signal connection line 500. The shielding layer 900 is insulated from the first signal connection line 500 and the fan-out lead 700.

An orthographic projection of the shielding layer 900 on the substrate 800 in the display panel 000 at least partially overlaps an orthographic projection of the first signal connection line 500 on the substrate 800, and at least partially overlaps an orthographic projection of the fan-out lead 700 on the substrate 800. In this way, the shielding layer 900 reduces or avoids interference between an electrical signal on the first signal connection line 500 and an electrical signal on the fan-out lead 700, thereby ensuring a good display effect of the display panel 000.

In some embodiments of the present disclosure, the orthographic projection of the shielding layer 900 on the substrate 800 in the display panel 000 covers at least a part of an overlapping region of the orthographic projection of the first signal connection line 500 on the substrate 800 and the orthographic projection of the fan-out lead 700 on the substrate 800. In this way, the shielding layer 900 reduces or avoids interference on other traces in the display panel 000, which is beneficial for routing other traces in the non-display region 00*b*.

In the present disclosure, in the case that the display panel 000 includes the shielding layer 900, the second signal connection line 600 and the first signal connection line 500 are disposed in a same layer and made of a same material, or the second signal connection line 600 and the shielding layer 900 are disposed in a same layer and made of a same material. In another possible embodiment, a part of the second signal connection line 600 is disposed in a same layer and made of a same material as the first signal connection line 500, and the other part of the second signal connection line 600 is disposed in a same layer and made of a same material as the shielding layer 900. That is, the second signal connection line 600 is formed by two layers of metal traces, such that the second signal connection line 600 electrically connects the part of the pads in the first pad group 100 to the part of the pads in the second pad group 200 through two layers of traces. In this way, the resistance of the second signal connection line 600 is further reduced, and the good display effect of the display panel 000 is ensured.

In the case that the second signal connection line 600 and the first signal connection line 500 are disposed in the same layer and made of the same material, a film layer relationship of the second signal connection line 600 is shown in FIG. 4, and a film layer relationship of the first signal connection line 500 is shown in FIG. 6. That is, the second signal connection line 600 and the first signal connection line 500 are formed through one patterning process.

In the case that the second signal connection line 600 and the shielding layer 900 are disposed in the same layer, referring to FIG. 7 which is a schematic diagram of another film layer structure at A-A' shown in FIG. 3, the orthographic projection of the second signal connection line 600 on the substrate 800 does not overlap the orthographic projection of the shielding layer 900 on the substrate 800, thereby ensuring that the second signal connection line 600 and the shielding layer 900 do not form a short circuit. It should be noted that in FIG. 7, a case, in which the first pad group 100 and the second pad group 200 are disposed in the same layer at A-A' and the first pad group 100 and the second pad group 200 are electrically connected to the film layer in which the second signal connection line 600 is disposed, is merely used as an example for description. In another possible implementation, the first pad group 100 and the second pad group 200 are disposed in the same layer or different layers, which is not limited in the present disclosure.

Figure 8:
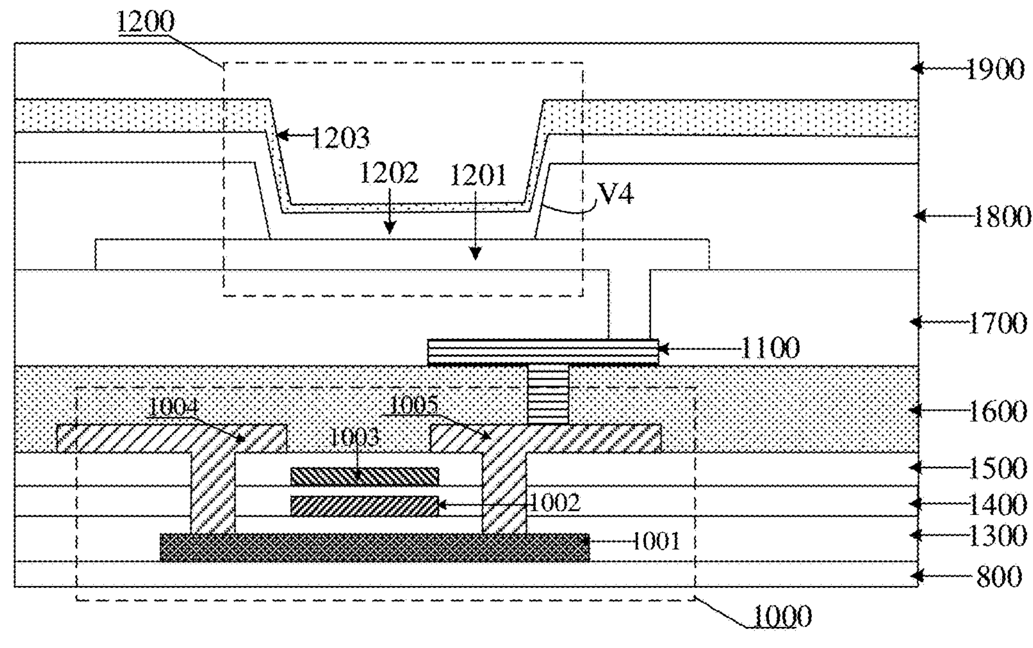
FIG. 8 is a schematic diagram of a film layer structure of a display panel according to some embodiments of the present disclosure.

In some embodiments of the present disclosure, referring to FIG. 8, which is a schematic diagram of a film layer structure of a display panel according to some embodiments of the present disclosure, the display panel 000 further includes a pixel drive circuit 1000 and a transfer electrode 1100 in the display region 00*a*. The pixel drive circuit 1000 is closer to the substrate 800 in the display panel 000 than the light-emitting device 1200. The transfer electrode 1100 is disposed between the pixel drive circuit 1000 and the light-emitting device 1200 and electrically connected to the pixel drive circuit 1000 and the light-emitting device 1200. Upon the drive chip being bound to the first pad group 100 in the display panel 000, the drive chip applies the electrical signal to the light-emitting device 1200 through the pixel drive circuit 1000, making the light-emitting device 1200 to emit light, and thus enabling the display panel 000 to display an image.

The transfer electrode 1100 and the first signal connection line 500 are disposed in a same layer and made of a same material. That is, the transfer electrode 1100 and the first signal connection line 500 are formed through one patterning process.

There are a plurality of pixel drive circuits 1000. Each pixel drive circuit 1000 includes an active layer 1001, a first gate electrode 1002, a second gate electrode 1003, a source electrode 1004, and a drain electrode 1005. The active layer 1001 is insulated from the first gate electrode 1002 through a first gate insulation layer 1300. The active layer 1001 is insulated from the second gate electrode 1003 through a second gate insulation layer 1400. The active layer 1001 is electrically connected to the source electrode 1004 and the drain electrode 1005. Usually, the source electrode 1004 and the drain electrode 1005 are disposed in a same layer. That is, the source electrode 1004 and the drain electrode 1005 are parts of a same conductive pattern. The conductive pattern in which the source electrode 1004 and the drain electrode 1005 are included is insulated from the second gate electrode 1003 through the first insulation layer 1500.

It should be noted that the active layer 1001, the first gate electrode 1002, the second gate electrode 1003, the source electrode 1004, and the drain electrode 1005 constitute a thin film transistor. A top-gate thin-film transistor is used for schematic description in the embodiments of the present disclosure. In another optional implementation, the thin-film transistor is a bottom-gate thin-film transistor, which is not limited in the embodiments of the present disclosure.

One of the source electrode 1004 and the drain electrode 1005 is electrically connected to the light-emitting device 1200 through the transfer electrode 1100. In some embodiments, the transfer electrode 1100 is insulated from the drain electrode 1005 through a second insulation layer 1600. The plurality of pixel drive circuits 1000 are electrically connected to a plurality of light-emitting devices 1200 in a one-to-one correspondence.

In some embodiments, the light-emitting device 1200 includes an anode layer 1201, a light-emitting layer 1202, and a cathode layer 1203 that are stacked. The light-emitting device 1200 is an organic light-emitting diode (OLED). Each pixel drive circuit 1000 is electrically connected to the anode layer 1201 in the corresponding light-emitting device 1200 through the transfer electrode 1100. In some embodiments, there is a first planarization layer 1700 between the transfer electrode 1100 and the anode layer 1201.

In some embodiments, the display panel 000 further includes a pixel defining layer 1800. A part of the pixel-defining layer 1800 located in the display region 00*a* is provided with a plurality of pixel holes V4. Within each pixel bole V4, a part of the anode layer 1201 within the pixel hole V4, a part of the light-emitting layer 1202 within the pixel bole V4, and a part of the cathode layer 1203 within the pixel hole V4 constitute a light-emitting device 1200.

In some embodiments, the display panel 000 further includes an encapsulation layer 1900. The encapsulation layer 1900 is configured to encapsulate the light-emitting device 1200, to prevent the light-emitting layer 1202 in the light-emitting device 1200 from being damaged due to corrosion by moisture, oxygen, and the like in the air. Therefore, the encapsulation layer 1900 effectively prolongs a service life of the light-emitting device 1200.

In some embodiments of the present disclosure, in the case that the second signal connection line 600 and the first signal connection line 500 are disposed in the same layer and made of the same material, the second signal connection line 600 and the transfer electrode 1100 are disposed in the same layer and made of the same material. Alternatively, in the case that the second signal connection line 600 and the shielding layer 900 are disposed in the same layer and made of the same material, the second signal connection line 600 and an electrode, in the pixel drive circuit 100, electrically connected to the transfer electrode 1100 are disposed in the same layer and made of the same material.

In some embodiments of the present disclosure, the fan-out lead 700, the first gate electrode 1002, and the second gate electrode 1003 are disposed in a same layer and made of a same material. Fan-out leads 700 in two adjacent layers are insulated by the second gate insulation layer 1400. The first signal connection line 500 is insulated from the fan-out lead 700 through the first insulation layer 1500 and the second insulation layer 1600.

In the case that the display panel 000 includes the shielding layer 900, the shielding layer 900, the source electrode 1004, and the drain electrode 1005 are disposed in a same layer and made of a same material. That is, the shieldling layer 900, the source electrode 1004, and the drain electrode 1005 are formed through one patterning process. The shielding layer 900 is insulated from the first signal connection line 500 through the second insulation layer 1600. The shielding layer 900 is insulated from the fan-out lead 700 through the first insulation layer 1500.

In the case that the second signal connection line 600 and the first signal connection line 500 are disposed in the same layer and made of the same material, the second signal connection line 600, the first signal connection line 500, and the transfer electrode 1100 are disposed in the same layer and made of the same material. That is, the second signal connection line 600, the first signal connection line 500, and the transfer electrode 1100 are formed through one patterning process.

In the case that the second signal connection line 600 and the shielding layer 900 are disposed in the same layer and made of the same material, the second signal connection line 600 and the source electrode 1004 and the drain electrode 1005 in the pixel drive circuit 100 are disposed in the same layer and made of the same material. That is, the second signal connection line 600, the source electrode 1004, and the drain electrode 1005 are formed through one patterning process.

In the case that a part of the second signal connection line 600 and the first signal connection line 500 are disposed in the same layer and made of the same material and the other part of the second signal connection line 600 and the shielding layer 900 are disposed in the same layer and made of the same material, the part of the second signal connection line 600 and the transfer electrode 1100 are disposed in the same layer and made of the same material, that is, the part of the second signal connection line 600 and the transfer electrode 1100 are formed through one patterning process; and the other part of the second signal connection line 600 and the source electrode 1004 and the drain electrode 1005 in the pixel drive circuit 100 are disposed in the same layer and made of the same material, that is, the other part of the second signal connection line 600, the source electrode 1004, and the drain electrode 1005 are formed through one patterning process.

Figure 9:
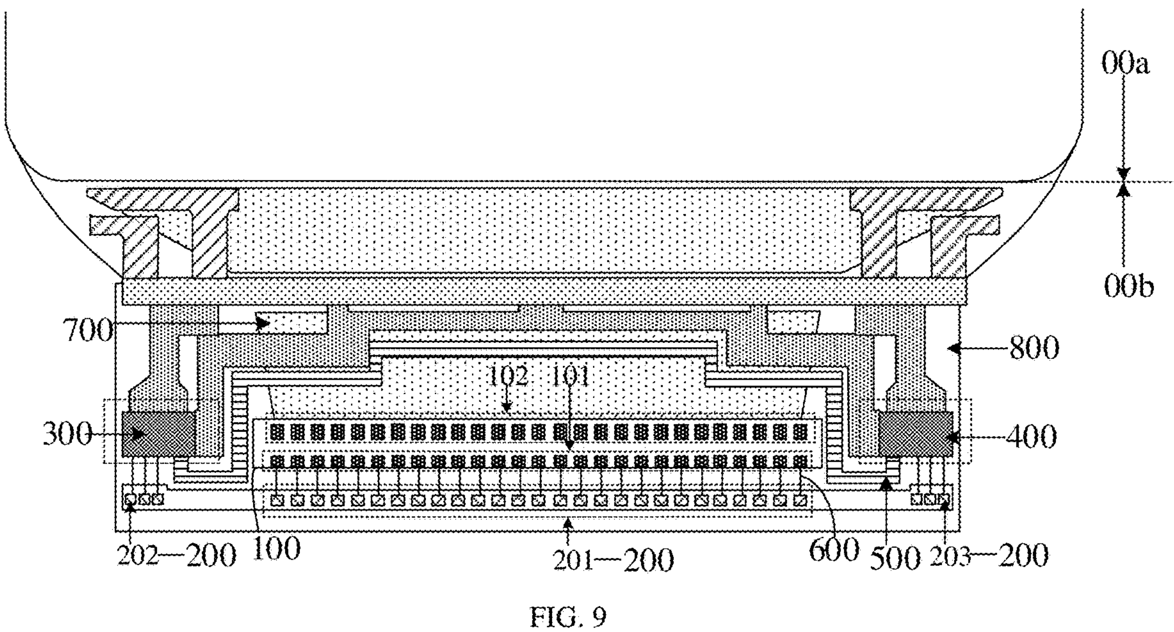
FIG. 9 is a schematic top view of another display panel according to some embodiments of the present disclosure.

In some embodiments of the present disclosure, referring to FIG. 9, which is a schematic top view of another display panel according to some embodiments of the present disclosure, the first pad group 100 in the display panel 000 includes a plurality of first sub-pads 101 and a plurality of second sub-pads 102. The plurality of second sub-pads 102 are closer to the display region 00*a* than the plurality of first sub-pads 101. The plurality of second sub-pads 102 are electrically connected to a plurality of fan-out leads 700 respectively. The plurality of second sub-pads 102 are electrically connected to the plurality of fan-out leads 700 in a one-to-one correspondence. The plurality of first sub-pads 101 are electrically connected to a plurality of second signal connection lines 600 in a one-to-one correspondence. Upon the drive chip being bound to the first pad group 100, the drive chip applies the electrical signal to the light-emitting device in the display region 00*a* of the display panel 000 through the second sub-pads 102 and the fan-out leads 700.

In some embodiments, the second pad group 200 includes a plurality of third sub-pads 201. The plurality of third sub-pads 201 are electrically connected to the plurality of first sub-pads 101 through the plurality of second signal connection lines 600. One second signal connection line 600 connects one third sub-pad 201 to one first sub-pads 101. Upon the flexible circuit board being bound to the second pad group 200, the flexible circuit board applies the electrical signal to the drive chip through the third sub-pads 201, the second signal connection lines 600, and the first sub-pads 101, to enable the drive chip to work.

In some embodiments of the present disclosure, as shown in FIG. 9, the second pad group 200 further includes a plurality of fourth sub-pads 202 on one side of the plurality of third sub-pads 201 and a plurality of fifth sub-pads 203 on the other side of the plurality of third sub-pads 201. The plurality of fourth sub-pads 202 are electrically connected to the first selection circuit 300. The plurality of fifth sub-pads 203 are electrically connected to the second selection circuit 400. Upon the flexible circuit board being bound to the second pad group 200, a touch chip on the flexible circuit board applies a touch electrical signal to the first selection circuit 300 through the fourth sub-pads 202 and applies a touch electrical signal to the second selection circuit 400 through the fifth sub-pads 203, to ensure the normal work of the touch unit in the display panel 000.

Figure 10:
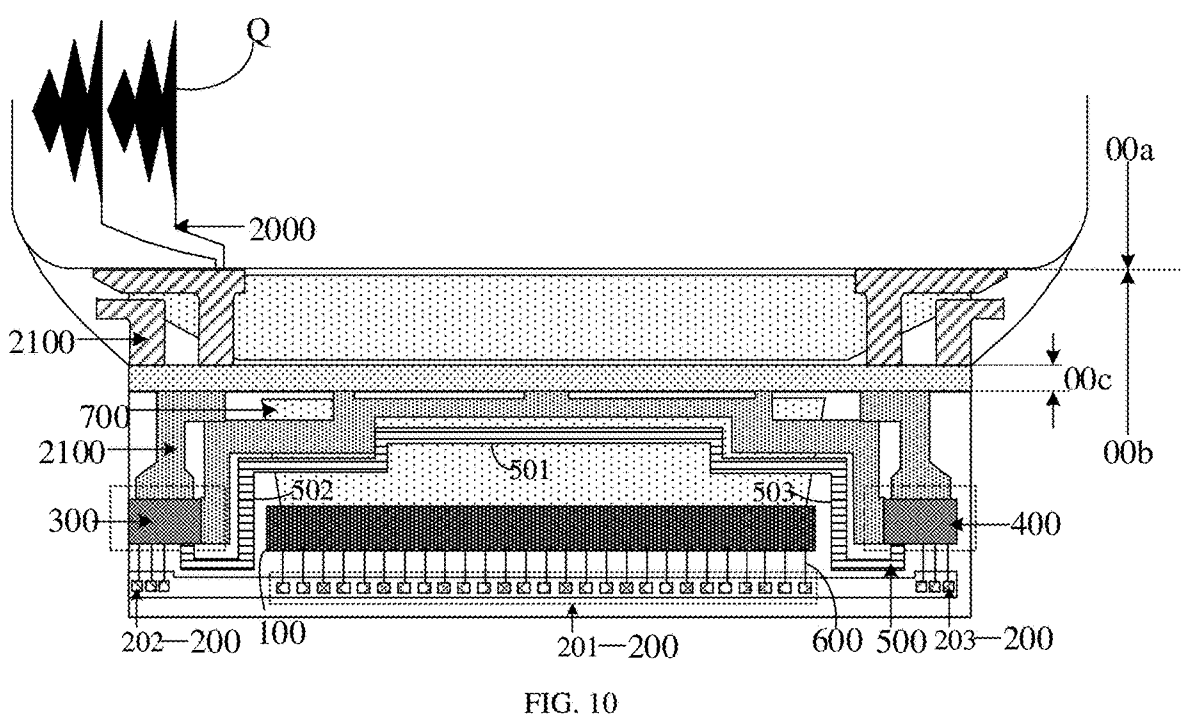
FIG. 10 is a schematic top view of still another display panel according to some embodiments of the present disclosure.

In the present disclosure, referring to FIG. 10, which is a schematic top view of still another display panel according to some embodiments of the present disclosure, the non-display region 00*b* of the display panel 000 includes a bending region 00*c*. The bending region 00*c* is between the first pad group 100 and the display region 00*a*. A part of the first signal connection line 500 is disposed between the bending region 00*c* and the first pad group 100. The bending region 00*c* is provided with a groove. The display panel 000 on a side of the bending region 00*c* away from the display region 00*a* is bent to the back of the display region 00*a* through the groove, such that a width of the non-display region 00*b* in the display panel 000 is reduced and a screen-to-body ratio of the display panel 000 is increased.

In some embodiments of the present disclosure, the first signal connection line 500 includes a jumper 501 between the bending region 00*c* and the first pad group 100, and a first sub-connection line 502 and a second sub-connection line 503 respectively connected to two ends of the jumper 501.

An end of the first sub-connection line 502 distal from the jumper 501 is electrically connected to the first selection circuit 300. An end of the second sub-connection line 503 distal from the jumper 501 is electrically connected to the second selection circuit 400. Because the first signal connection line 500 further includes the first sub-connection line 502 and the second sub-connection line 503, the first signal connection line 500 connecting the first selection circuit 300 to the second selection circuit 400 is long. In some embodiments, the first signal connection line 500 is longer than a signal connection line connecting the first selection circuit to the second selection circuit in the related art for 8 millimeters.

In some embodiments of the present disclosure, a thickness of the first signal connection line 500 in the display panel 000 ranges from 6 microns to 7 microns. An extension direction of the jumper 501 in the first signal connection line 500 is the same as an extension direction of the second pad group 200 in the display panel 000. An extension direction of the first sub-connection line 502 in the first signal connection line 500 intersects the extension direction of the jumper 501. An extension direction of the second sub-connection line 503 in the first signal connection line 500 also intersects the extension direction of the jumper 501. In this way, even if the first signal connection line 500 is long, it is ensured that a resistance of the first signal connection line 500 is low. Therefore, it is ensured that an effect of simultaneously driving the first selection circuit 300 and the second selection circuit 400 through the first signal connection line 500 is good.

It should be noted that in some embodiments, the first selection circuit 300 and the second selection circuit 400 include a plurality of functional thin film transistors, wherein the thin-film transistors are connected according to a specific circuit principle. Therefore, there are usually a large number of first signal connection lines 500. During the process of disposing the jumper 501 between the bending region 00*c* and the first pad group 100, the jumper 501 is adjusted based on other traces in the display panel 000. The trace of the jumper 501 is straight as a whole and locally adjusted depending on actual positions. Similarly, the first sub-connection line 502 and the second sub-connection line 503 are also adjusted depending on actual positions, which is not limited in the embodiments of the present disclosure.

In some embodiments of the present disclosure, because the non-display region 00*b* includes the bending region 00*c*, the fan-out lead 700 is divided into two parts. A film layer position of a part of the fan-out lead 700 located between the bending region 00*c* and the display region 00*a* is different from a film layer position of the other part of the fan-out lead 700 located on a side of the bending region 00*c* away from the display region 00*a*, which is not limited in the embodiments of the present disclosure.

In some embodiments of the present disclosure, there are a plurality of touch units Q in the display panel 000. The display panel 000 further includes a plurality of touch signal lines 2000 in the display region 00*a* and a plurality of touch signal leads 2100 in the non-display region 00*b*. The plurality of touch signal lines 2000 are electrically connected to the plurality of touch units Q in a one-to-one correspondence, and are electrically connected to the plurality of touch signal leads 2100 in a one-to-one correspondence. To ensure the good display effect of the display panel 000, the touch unit Q in the display region 00*a* is a transparent electrode with a touch function. The touch signal line 2000 in the display region 00*a* is a signal line made of a transparent conductive material. In another possible implementation, the touch unit Q is a metal grid-shaped electrode. The metal grid-shaped electrode is provided with a plurality of grid boles, such that light emitted by the light-emitting device in the display panel 000 can transmit. It should be noted that a material of the touch signal lead 2100 is the same as a material of the touch signal line 2000 or different from the material of the touch signal line 2000, which is not limited in the embodiments of the present disclosure.

In the plurality of touch signal leads 2100, part of touch signal leads 2100 are electrically connected to the first selection circuit 300, and the other part of touch signal leads 2100 are electrically connected to the second selection circuit 400. The touch signal line 2000 and the touch signal lead 2100 are usually disposed in a same layer as the touch unit Q. The touch unit Q is disposed on a side of the encapsulation layer 1900 in the display panel 000 away from the substrate 800. Therefore, to ensure that the touch signal lead 2100 is electrically connected to the first selection circuit 300 and the second selection circuit 400, a plurality of via boles need to be provided in the encapsulation layer 1900. In this way, the touch signal lead 2100 is electrically connected to the first selection circuit 300 and the second selection circuit 400 through the via holes.

Figure 11:
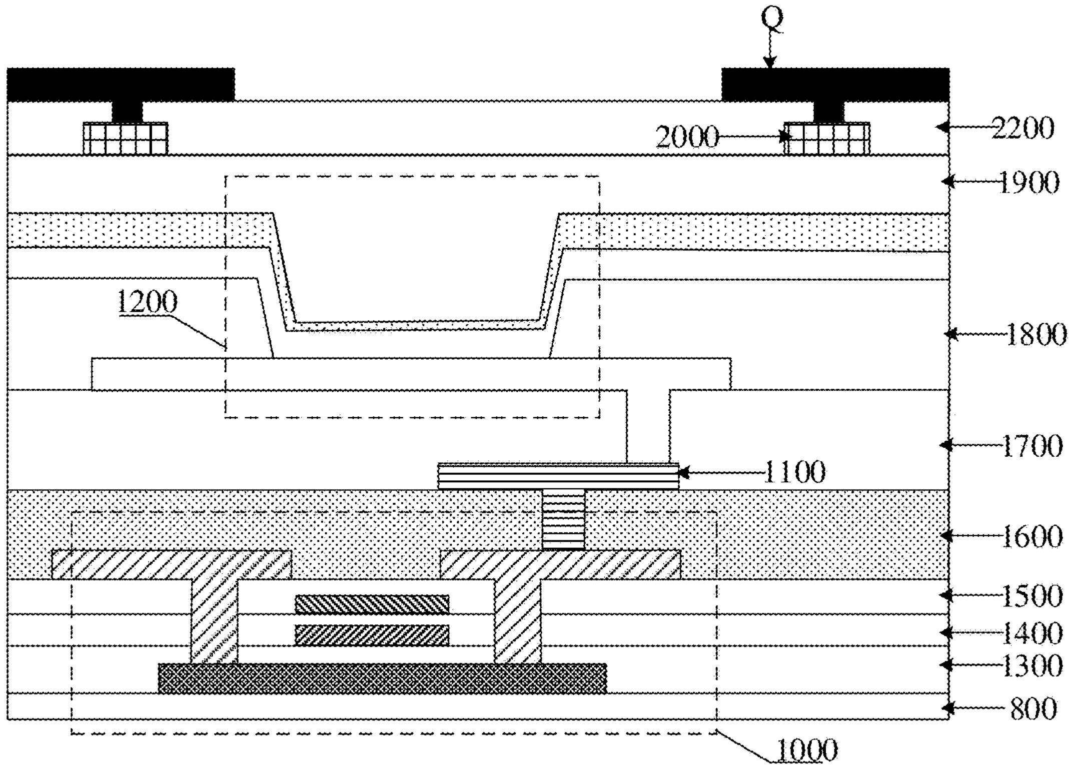
FIG. 11 is a schematic diagram of a film layer structure of another display panel according to some embodiments of the present disclosure.

To clearly view a film layer structure of the display panel, refer to FIG. 11. FIG. 11 is a schematic diagram of a film layer structure of another display panel according to some embodiments of the present disclosure. The touch unit Q and the touch signal line 2000 constitute a touch layer, such that the display panel 000 achieves the touch function. The touch unit Q and the touch signal line 2000 are disposed in a same layer or different layers. In the embodiments of the present disclosure, an example in which the touch unit Q and the touch signal line 2000 are disposed in different layers is only used for description.

In the case that the touch unit Q and the touch signal line 2000 are disposed in different layers, the touch unit Q is insulated from the touch signal line 2000 through a third insulation layer 2200. In this case, the first pad group 100 and the second pad group 200 are disposed in the same layer and made of the same material, and at least partially disposed in the same layer and made of the same material as one of the touch unit Q and the touch signal line 2000. For the case that the first pad group 100 and the second pad group 200 are disposed in the same layer as the touch unit Q, there are at least two cases. In one case, the second signal connection line 600 in the display panel 000 is disposed in the same layer as the transfer electrode 1100. As shown in FIG. 4, via holes are provided in the first planarization layer 1700, the pixel-defining layer 1800, and the encapsulation layer 1900, such that the first pad group 100 and the second pad group 200 are electrically connected to the second signal connection line 600. In another case, the second signal connection line 600 in the display panel 000 is disposed in the same layer as the shielding layer 900. As shown in FIG. 7, via holes are provided in the second insulation layer 1600, the first planarization layer 1700, the pixel-defining layer 1800, and the encapsulation layer 1900, such that the first pad group 100 and the second pad group 200 are electrically connected to the second signal connection line 600.

It should be noted that in the embodiments of the present disclosure, FIG. 4 and FIG. 7 only show an example in which all structures of the first pad group 100 and the second pad group 200 are disposed in a same film layer for schematic description. In another possible implementation, each of the first pad group 100 and the second pad group 200 is composed of a plurality of conductive layers, which is not limited in the embodiments of the present disclosure.

For the case that the first pad group 100 and the second pad group 200 are disposed in the same layer as the touch signal line 2000, there also are at least two cases. In one case, the second signal connection line 600 in the display panel 000 is disposed in the same layer as the transfer electrode 1100. Via holes are disposed in the first planarization layer 1700, the pixel-defining layer 1800, the encapsulation layer 1900, and the third insulation layer 2200, such that the first pad group 100 and the second pad group 200 are electrically connected to the second signal connection line 600. In another case, the second signal connection line 600 in the display panel 000 is disposed in the same layer as the shielding layer 900. As shown in FIG. 7, via holes are provided in the second insulation layer 1600, the first planarization layer 1700, the pixel-defining layer 1800, the encapsulation layer 1900, and the third insulation layer 2200, such that the first pad group 100 and the second pad group 200 are electrically connected to the second signal connection line 600.

Figure 12:
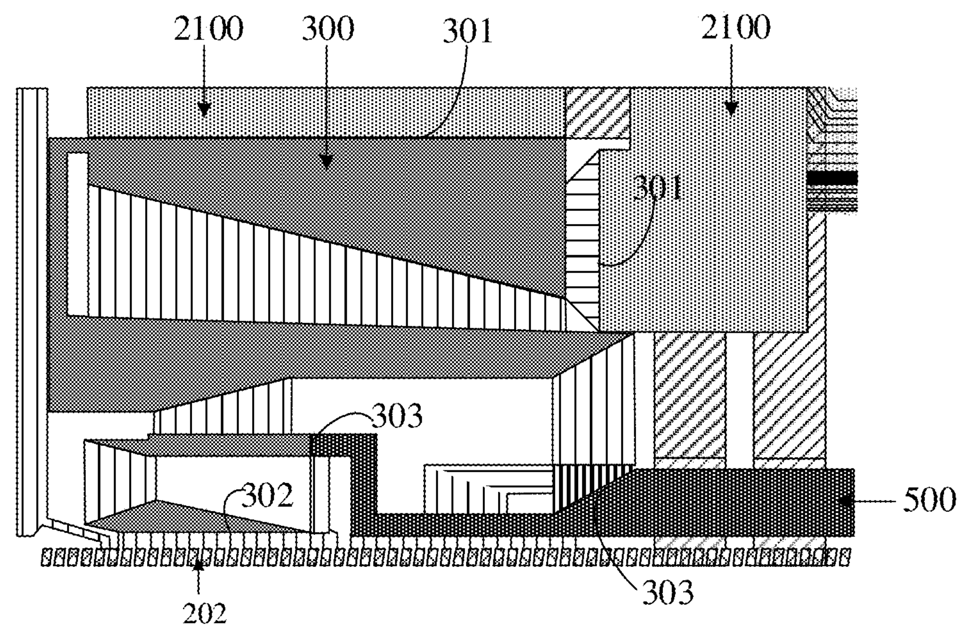
FIG. 12 is a schematic top view of a first selection circuit according to some embodiments of the present disclosure.
Figure 13:
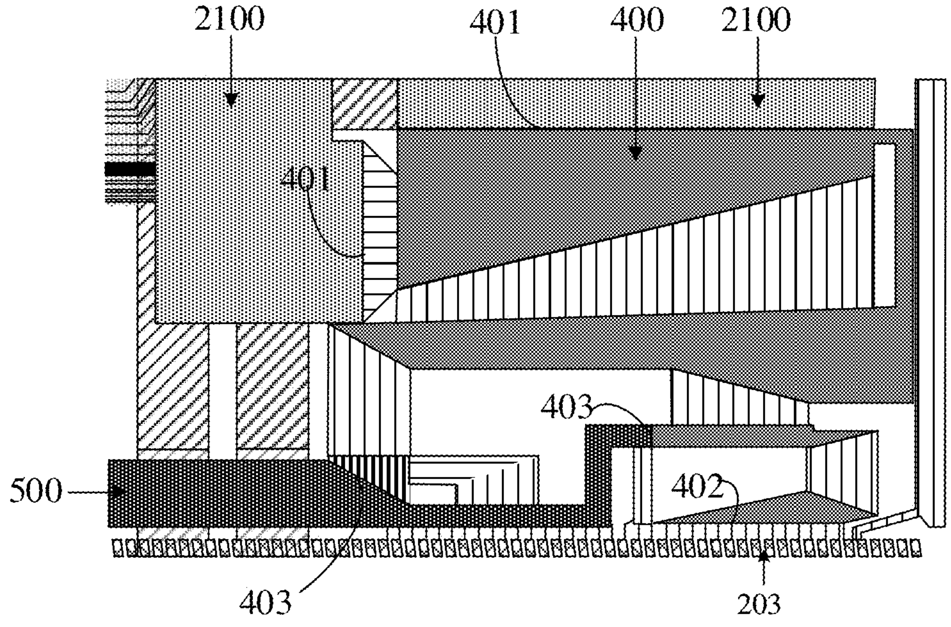
FIG. 13 is a schematic top view of a second selection circuit according to some embodiments of the present disclosure.

In some embodiments of the present disclosure, please refer to FIG. 12 and FIG. 13. FIG. 12 is a schematic top view of a first selection circuit according to some embodiments of the present disclosure. FIG. 13 is a schematic top view of a second selection circuit according to some embodiments of the present disclosure. The first selection circuit 300 includes a first port 301, a second port 302, and a third port 303. The second selection circuit 400 includes a first port 401, a second port. 402, and a third port 403.

The first selection circuit 300 is electrically connected to part of the touch signal leads 2100 through two first ports 301. The first selection circuit 300 is electrically connected to the fourth sub-pads 202 in the second pad group 200 through one second port 302. The first selection circuit 300 is electrically connected to two second ports 402 of the second selection circuit 400 through two third ports 303 in a one-to-one correspondence. The second selection circuit 400 is electrically connected to part of the touch signal leads 2100 through two first ports 401. The second selection circuit 400 is electrically connected to the fifth sub-pads 203 in the second pad group 200 through one second port 402. The second selection circuit 400 is electrically connected to two second ports 302 of the first selection circuit 300 through two third ports 403. Part of the first signal connection lines 500 electrically connect one third port 303 of the first selection circuit 300 to one corresponding third port 403 of the second selection circuit 400. The other part of the first signal connection lines 500 electrically connect the other third port 303 of the first selection circuit 300 to the other corresponding third port 403 of the second selection circuit 400.

In this case, upon the flexible circuit board having the touch chip being bound to the second pad group 200, the touch chip simultaneously opens the third port 303 of the first selection circuit 300 and the corresponding third port 403 of the second selection circuit 400 through the part of the first signal connection lines 500, to make all touch units Q in the display panel 000 be reset. Then, in response to a user's finger touching the display panel 000, the first selection circuit 300 senses a touch signal through the corresponding first port 301 and transmits the touch signal to the touch chip through the second port. 302, and the second selection circuit 400 also senses a touch signal through the corresponding first port 401 and transmits the touch signal to the touch chip through the second port 402. Then, the touch chip applies a control signal to a corresponding touch unit Q in the display panel 000 through the other part of the first signal connection lines 500 by simultaneously controlling the first selection circuit 300 and the second selection circuit 400 based on the sensed touch signal. In this way, the display panel 000 achieves the touch function.

In summary, the display panel provided in the embodiments of the present disclosure includes the touch unit, the first pad group, the second pad group, the first selection circuit, the second selection circuit, the first signal connection line, and the second signal connection line. Because the first pad group is closer to the display region than the second pad group, and the part of the first signal connection line is disposed on the side of the first pad group away from the second pad group, the part of the first signal connection line on the side of the first pad group away from the second pad group does not overlap the second signal connection line. In this way, the trace density in the region between the first pad group and the second pad group in the display panel is reduced, such that the second signal connection line can be disposed in the same layer as the film layer other than the conductive layer made of the material with the high resistance, and the resistance of the second signal connection line is reduced. The part of the pads in the first pad group and the part of the pads in the second pad group is electrically connected through the second signal connection line, such that the effect that the flexible circuit board applies the electrical signal to the drive chip through the second signal connection line is good and the display effect of the display panel is good.

Embodiments of the present disclosure further provide a display apparatus. The display apparatus is any product or component with a display function, such as a mobile phone, a tablet computer, a television, a display, a notebook computer, a digital photo frame, or a navigator. The display apparatus includes a drive chip, a flexible circuit board, and a display panel. In some embodiments, the display panel is an OLED display panel or an active-matrix OLED (AMOLED) display panel.

In some embodiments of the present disclosure, the display panel 000 is the display panel 000 in the foregoing embodiments, such as the display panel shown in FIG. 3, FIG. 9, or FIG. 10. The drive chip is electrically connected to the first pad group 100 in the display panel. The flexible circuit board is electrically connected to the second pad group 200 in the display panel 000.

It should be noted that in the accompanying drawings, sizes of layers and regions are exaggerated for clarity of illustration. In addition, it can be understood that when an element or layer is referred to as being "on" another element or layer, the element or layer is directly disposed on the another element or layer, or there is an intervening layer between the elements or layers. It can be understood that when an element or layer is referred to as being "under" another element or layer, the element or layer is directly under the another element or layer, or there is at least one intervening layer or element between the elements or layers. It can be understood that when a layer or element is referred to as being "between" two layers or elements, the layer or element is the only layer or element between the two layers or elements, or there is at least one intervening layer or element between the two layers or elements. Similar reference numerals indicate similar elements.

In the present disclosure, terms such as "first" and "second" are merely intended for the purpose of description, and should not be understood as indicating or implying relative importance. The term "a plurality of" means two or more, unless otherwise specifically defined.

The foregoing descriptions are merely optional embodiments of the present disclosure and are not intended to limit the present disclosure. Any modification, equivalent replacement, and improvement within the concept and principle of the present disclosure are included within the protection scope of the present disclosure.

What is claimed is:

1. A display panel, having a display region and a non-display region at a periphery of the display region, and comprising:

a touch unit in the display region;

a first pad group, a second pad group, a first selection circuit, and a second selection circuit in the non-display region, wherein the first selection circuit and the second selection circuit are electrically connected to the touch unit, and the first pad group is closer to the display region than the second pad group;

a first signal connection line and a second signal connection line in the non-display region, wherein the first signal connection line is connected to the first selection circuit and the second selection circuit, a part of the first signal connection line is disposed on a side of the first pad group away from the second pad group and does not overlap the second signal connection line, and the second signal connection line is disposed between the first pad group and the second pad group and electrically connected to part of pads in the first pad group and part of pads in the second pad group; and a light-emitting device in the display region and a fan-out lead in the non-display region, wherein the fan-out lead is electrically connected to the light-emitting device and another part of the pads in the first pad group; and the fan-out lead is disposed in a different layer from the first signal connection line and the second signal connection line.

2. The display panel according to claim 1, wherein the first signal connection line and the second signal connection line are disposed in a same layer and made of a same material.

3. The display panel according to claim 1, further comprising a shielding layer between the fan-out lead and the first signal connection line, wherein the shielding layer is insulated from the first signal connection line and the fan-out lead; and an orthographic projection of the shielding layer on a substrate in the display panel at least partially overlaps an orthographic projection of the first signal connection line on the substrate, and at least partially overlaps an orthographic projection of the fan-out lead on the substrate.

4. The display panel according to claim 3, wherein the orthographic projection of the shielding layer on the substrate in the display panel covers an overlapping region of the orthographic projection of the first signal connection line on the substrate and the orthographic projection of the fan-out lead on the substrate.

5. The display panel according to claim 3, wherein the second signal connection line and the first signal connection line are disposed in a same layer and made of a same material, or the second signal connection line and the shielding layer are disposed in a same layer and made of a same material.

6. The display panel according to claim 5, further comprising a pixel drive circuit and a transfer electrode in the display region, wherein the pixel drive circuit is closer to the substrate in the display panel than the light-emitting device, and the transfer electrode is disposed between the pixel drive circuit and the light-emitting device and electrically connected to the pixel drive circuit and the light-emitting device; and the transfer electrode and the first signal connection line are disposed in a same layer and made of a same material.

7. The display panel according to claim 6, wherein in a case that the second signal connection line and the first signal connection line are disposed in the same layer and made of the same material, the second signal connection line and the transfer electrode are disposed in a same layer and made of a same material; and in a case that the second signal connection line and the shielding layer are disposed in the same layer and made of the same material, the second signal connection line and an electrode, in the pixel drive circuit, electrically connected to the transfer electrode are disposed in a same layer and made of a same material.

8. The display panel according to claim 1, wherein the first pad group comprises a plurality of first sub-pads and a plurality of second sub-pads, the plurality of second sub-pads being closer to the display region than the plurality of first sub-pads, and the plurality of second sub-pads being electrically connected to a plurality of fan-out leads respectively; and the second pad group comprises a plurality of third sub-pads, the plurality of third sub-pads being electrically connected to the plurality of second sub-pads through a plurality of second signal connection lines.

9. The display panel according to claim 8, wherein the second pad group further comprises a plurality of fourth sub-pads on one side of the plurality of third sub-pads and a plurality of fifth sub-pads on the other side of the plurality of third sub-pads, the plurality of fourth sub-pads being electrically connected to the first selection circuit, and the plurality of fifth sub-pads being electrically connected to the second selection circuit.

10. The display panel according to claim 1, wherein the non-display region comprises a bending region, the bending region being between the first pad group and the display region, and a part of the first signal connection line being disposed between the bending region and the first pad group.

11. The display panel according to claim 10, wherein the first signal connection line comprises a jumper between the bending region and the first pad group, and a first sub-connection line and a second sub-connection line respectively connected to two ends of the jumper; wherein an end of the first sub-connection line distal from the jumper is electrically connected to the first selection circuit, and an end of the second sub-connection line distal from the jumper is electrically connected to the second selection circuit.

12. The display panel according to claim 11, wherein a thickness of the first signal connection line ranges from 6 microns to 7 microns.

13. The display panel according to claim 1, wherein there are a plurality of touch units, and the display panel further comprises a plurality of touch signal lines in the display region and a plurality of touch signal leads in the non-display region; wherein the plurality of touch signal lines are electrically connected to the plurality of touch units in a one-to-one correspondence and electrically connected to the plurality of touch signal leads in a one-to-one correspondence; and part of touch signal leads in the plurality of touch signal leads are electrically connected to the first selection circuit, and another part of the touch signal leads in the plurality of touch signal leads are electrically connected to the second selection circuit.

14. The display panel according to claim 13, wherein the first pad group and the second pad group are disposed in a same layer and made of a same material, and at least partially disposed in a same layer and made of a same material as one of the touch unit and the touch signal line.

15. A display apparatus, comprising a drive chip, a flexible circuit board, and a display panel, wherein the display panel has a display region and a non-display region at a periphery of the display region, and comprises:

a touch unit in the display region;

a first pad group, a second pad group, a first selection circuit, and a second selection circuit in the non-display region, wherein the first selection circuit and the second selection circuit are electrically connected to the touch unit, and the first pad group is closer to the display region than the second pad group;

a first signal connection line and a second signal connection line in the non-display region, wherein the first signal connection line is connected to the first selection circuit and the second selection circuit, a part of the first signal connection line is disposed on a side of the first pad group away from the second pad group and does not overlap the second signal connection line, and the second signal connection line is disposed between the first pad group and the second pad group and electrically connected to part of pads in the first pad group and part of pads in the second pad group; and a light-emitting device in the display region and a fan-out lead in the non-display region, wherein the fan-out lead is electrically connected to the light-emitting device and another part of the pads in the first pad group; and the fan-out lead is disposed in a different layer from the first signal connection line and the second signal connection line; and the drive chip is electrically connected to the first pad group in the display panel, and the flexible circuit board is electrically connected to the second pad group in the display panel.

16. The display apparatus according to claim 15, wherein the first signal connection line and the second signal connection line are disposed in a same layer and made of a same material.

17. The display apparatus according to claim 15, wherein the display panel further comprises a shielding layer between the fan-out lead and the first signal connection line, wherein the shielding layer is insulated from the first signal connection line and the fan-out lead; and an orthographic projection of the shielding layer on a substrate in the display panel at least partially overlaps an orthographic projection of the first signal connection line on the substrate, and at least partially overlaps an orthographic projection of the fan-out lead on the substrate.

18. The display apparatus according to claim 17, wherein the orthographic projection of the shielding layer on the substrate in the display panel covers an overlapping region of the orthographic projection of the first signal connection line on the substrate and the orthographic projection of the fan-out lead on the substrate.

* * * * *